United States Patent
Lin

(10) Patent No.: US 9,007,242 B2
(45) Date of Patent: Apr. 14, 2015

(54) SELF-CALIBRATED DELTA-SIGMA MODULATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 14/191,506

(22) Filed: Feb. 27, 2014

(65) Prior Publication Data

US 2015/0002325 A1 Jan. 1, 2015

Related U.S. Application Data

(60) Provisional application No. 61/840,448, filed on Jun. 27, 2013.

(51) Int. Cl.
*H03M 1/10* (2006.01)
*H03M 3/00* (2006.01)

(52) U.S. Cl.
CPC ............... *H03M 3/368* (2013.01); *H03M 3/50* (2013.01)

(58) Field of Classification Search
CPC ........... H03M 1/12; H03M 1/00; H03M 3/30; H03M 1/089; H03M 1/0836; H03M 1/1071; H03M 1/1205; H03M 3/02; H03M 3/37; H03M 1/0641; H03M 1/0673; H03M 3/384; H03M 3/49
USPC .............................. 341/118–121, 143, 44, 155
See application file for complete search history.

(56) References Cited

U.S. PATENT DOCUMENTS

| | | | | |
|---|---|---|---|---|
| 6,624,772 B1 * | 9/2003 | Gealow et al. | ................. | 341/120 |
| 6,642,859 B1 * | 11/2003 | Hamilton et al. | ................. | 341/51 |
| 7,152,010 B1 * | 12/2006 | Tsyrganovich | ................. | 702/107 |
| 7,626,526 B2 * | 12/2009 | Philips | ................. | 341/143 |
| 7,679,539 B2 * | 3/2010 | Lee et al. | ................. | 341/144 |
| 8,378,869 B2 * | 2/2013 | Chae et al. | ................. | 341/143 |
| 8,643,518 B2 * | 2/2014 | da Silva et al. | ................. | 341/120 |
| 2002/0063647 A1 * | 5/2002 | Brooks et al. | ................. | 341/144 |

(Continued)

OTHER PUBLICATIONS

Ian Galton: "Why Dynamic-Element-Matching DACs Work"; IEEE Transactions on Circuits and Systems—II: Express Briefs, vol. 57, No. 2, Feb. 2010; pp. 69-74.

*Primary Examiner* — Linh Nguyen
(74) *Attorney, Agent, or Firm* — McClure, Qualey & Rodack, LLP

(57) ABSTRACT

A delta-sigma modulator and corresponding method are disclosed. In one implementation, the delta-sigma modulator includes a multiplexer for receiving an analog input signal and a common mode signal and outputting a multiplexed signal in accordance with a selection signal; a summing circuit for receiving the multiplexed signal and an analog feedback signal and outputting an error signal; a loop filter for receiving the error signal and outputting a filtered signal; a quantizer for receiving the filtered signal and outputting a raw digital output signal; a digital-to-analog converter for receiving the raw digital output signal and outputting the analog feedback signal along with a rotated digital output signal in accordance with a phase indicator and a rotation number; and a calibration logic for receiving the rotated digital output signal and a mode indicator and outputting the selection signal, the phase indicator, the rotation number, and a calibrated digital output signal.

15 Claims, 4 Drawing Sheets

(56) References Cited

U.S. PATENT DOCUMENTS

| | | | |
|---|---|---|---|
| 2009/0085785 A1* | 4/2009 | Gerfers et al. | 341/143 |
| 2010/0214142 A1* | 8/2010 | Akizuki et al. | 341/143 |
| 2011/0018605 A1* | 1/2011 | Cho et al. | 327/307 |
| 2011/0037631 A1* | 2/2011 | Lai et al. | 341/120 |

* cited by examiner

```
module rotator(Q, R, PH, D)
input [6:0] Q;
input [2:0] R;
input PH;
output [7:0] D;
reg [7:0] D;

always @ (Q or R or PH)
begin
if PH==0
case (R)
     0: D = {1'b0,Q[6:0]};
     1: D = {1'b0,Q[5:0],Q[6]};
     2: D = {1'b0,Q[4:0],Q[6:5]};
     3: D = {1'b0,Q[3:0],Q[6:4]};
     4: D = {1'b0,Q[2:0],Q[6:3]};
     5: D = {1'b0,Q[1:0],Q[6:2]};
     6: D = {1'b0,Q[0],Q[6:1]};
endcase
else
case (R)
     0: D = {Q[0],Q[6:1],1'b0};
     1: D = {Q[0],Q[5:1],1'b0,Q[6]};
     2: D = {Q[0],Q[4:1],1'b0,Q[6:5]};
     3: D = {Q[0],Q[3:1],1'b0,Q[6:4]};
     4: D = {Q[0],Q[2:1],1'b0,Q[6:3]};
     5: D = {Q[0],Q[1],1'b0,Q[6:2]};
     6: D = {Q[0],1'b0,Q[6:1]};
endcase
end
endmodule
```

FIG. 4

SELF-CALIBRATED DELTA-SIGMA MODULATOR AND METHOD THEREOF

CROSS-REFERENCE TO RELATED APPLICATION

The present application claims the benefit of provisional application Ser. No. 61/840,448, filed Jun. 27, 2013, the contents of which are incorporated herein by reference.

BACKGROUND OF THE INVENTION

1. Field of the Invention

The present invention relates to delta-sigma modulators.

2. Description of Related Art

As depicted in FIG. 1, a delta-sigma modulator (DSM) 100 receives an analog input signal and converts it into a digital output signal at a sampling rate appreciably higher than the bandwidth of the analog input signal. DSM 100 comprises a digital-analog converter (DAC) 104 for converting the digital output signal into an analog feedback signal, a subtraction circuit 101 for generating an error signal representing a difference between the analog input signal and the analog feedback signal, a loop filter 102 for filtering the error signal and outputting a filtered signal, and a quantizer 103 for quantizing the filtered signal into the digital output signal. DSM 100 spectrally shapes the quantization noises of the quantizer 103 so that the quantization noise appears as mostly high frequency noise in the digital output signal. As long as the sampling rate is sufficiently higher than the bandwidth of the analog input signal, the spectrally shaped quantization noise components are mostly beyond the bandwidth of the analog input signal and thus can be filtered out. This allows high resolution analog-digital conversion without using a high resolution quantizer. Principles and theories of DSM are well known in prior art and thus not explained in detail here. The quantizer 103 can be either a single-bit quantizer or a multi-bit quantizer. A multi-bit quantizer offers many advantages over a single-bit quantizer. However, when quantizer 103 is a multi-bit quantizer, DAC 104 also needs to be a multi-bit DAC, because DAC 104 must convert the digital output signal generated by quantizer 103 into the analog feedback signal. A practical multi-bit DAC is not perfectly linear, and its nonlinearities contribute to errors to the delta-sigma modulator 100 and thus degrade the performance.

Dynamic element matching techniques, e.g. DWA (data weighted averaging), can be used to spectrally shape the errors caused by the nonlinearities of the multi-bit DAC so that the errors also appear as high frequency noise. While dynamic element matching techniques are very effective in suppressing the static errors caused by the nonlinearities of the multi-bit DAC, they rely on dynamic and frequent changes in utilizing the constituent elements of the multi-bit DAC. This unfortunately may lead to an increase in dynamic errors that can degrade the performance of the delta-sigma modulator.

What is desired is a sigma-delta modulator that overcomes the shortcomings of the prior art.

BRIEF SUMMARY OF THIS INVENTION

The present invention provides a method of correcting the errors caused by nonlinearities of multi-bit digital-analog converters for delta-signal modulators without resorting to dynamic and frequent changes in utilizing the constituent elements of the digital-analog converters.

In an embodiment, a delta-sigma modulator comprises: a multiplexer for receiving an analog input signal and a common mode signal and outputting a multiplexed signal in accordance with a selection signal; a summing circuit for receiving the multiplexed signal and an analog feedback signal and outputting an error signal; a loop filter for receiving the error signal and outputting a filtered signal; a quantizer for receiving the filtered signal and outputting a raw digital output signal; a digital-to-analog converter for receiving the raw digital output signal and outputting the analog feedback signal along with a rotated digital output signal in accordance with a phase indicator and a rotation number; and a calibration logic for receiving the rotated digital output signal and a mode indicator and outputting the selection signal, the phase indicator, the rotation number, and a calibrated digital output signal.

In an embodiment, a method comprising: selecting between an analog input signal and a common mode signal to generate a multiplexed signal in accordance with a selection signal; subtracting an analog feedback signal from the multiplexed signal to generate an error signal; filtering the error signal to generate a filtered signal; quantizing the filtered signal to generate a raw digital output signal; rotating the raw digital output signal into a rotated digital output signal in accordance with a phase indicator and a rotation number; converting the rotated digital output signal into the analog feedback signal using a plurality of 1-bit DACs; performing a weighted sum on the rotated digital output signal to generate a calibrated digital output signal; and calibrating a weight of a 1-bit DAC of said plurality of 1-bit DACs by specifying a rotation number corresponding to the 1-bit DAC under calibration and calculating a difference of a first mean value of the calibrated digital output under a first value of the phase indicator and a second mean value of the calibrated digital output under a second value of the phase indicator.

In an embodiment, a method comprising: configuring a multi-bit digital-to-analog converter (DAC) within a delta-sigma modulator (DSM) into a first state; calculating a first mean value of an output of the DSM; configuring the multi-bit DAC into a second state; calculating a second mean value of the output of the DSM; obtaining a calibrated weight of the multi-bit DAC in accordance with a difference between the first mean value and the second mean value; and outputting a calibrated digital output signal based on a weighted sum of the output of DSM in accordance with the calibrated weight of the multi-bit DAC, wherein: the multi-bit DAC comprises a plurality of single-bit DAC cells, and a difference in configuration between the first state and the second state is that two constituent cells among said plurality of single-bit DAC cells are swapped.

BRIEF DESCRIPTION OF THE DRAWINGS

FIG. 4 shows an implementation, written in Verilog language, of a rotator suitable for the DAC of FIG. 3.

DETAILED DESCRIPTION OF THIS INVENTION

The present invention is directed to delta-sigma modulators, and in particular to delta-sigma modulators with self calibration. While the specification describes several example embodiments of the invention, it should be understood that the invention can be implemented in many ways and is not limited to the particular examples or embodiments described below or to the particular manner in which any features of such examples are implemented. In other instances, well-known details are not shown or described to avoid obscuring aspects of the invention.

Figure 1:
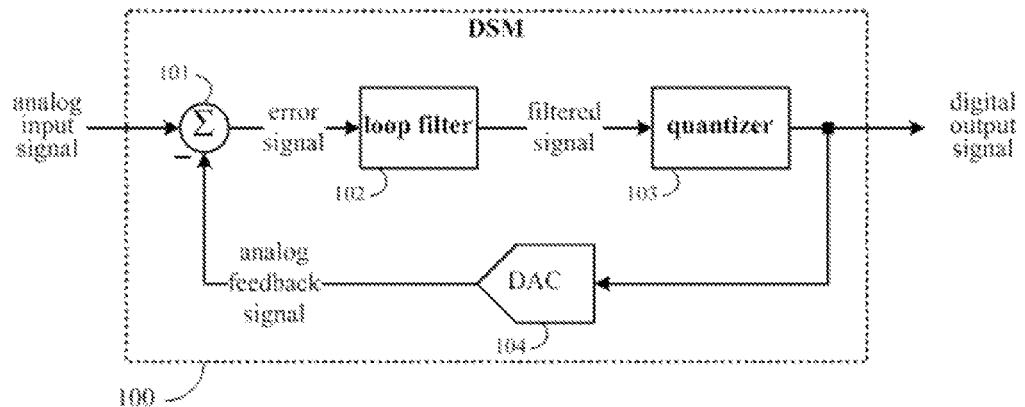
FIG. 1 shows a functional block diagram of a prior art delta-sigma modulator.
Figure 2:
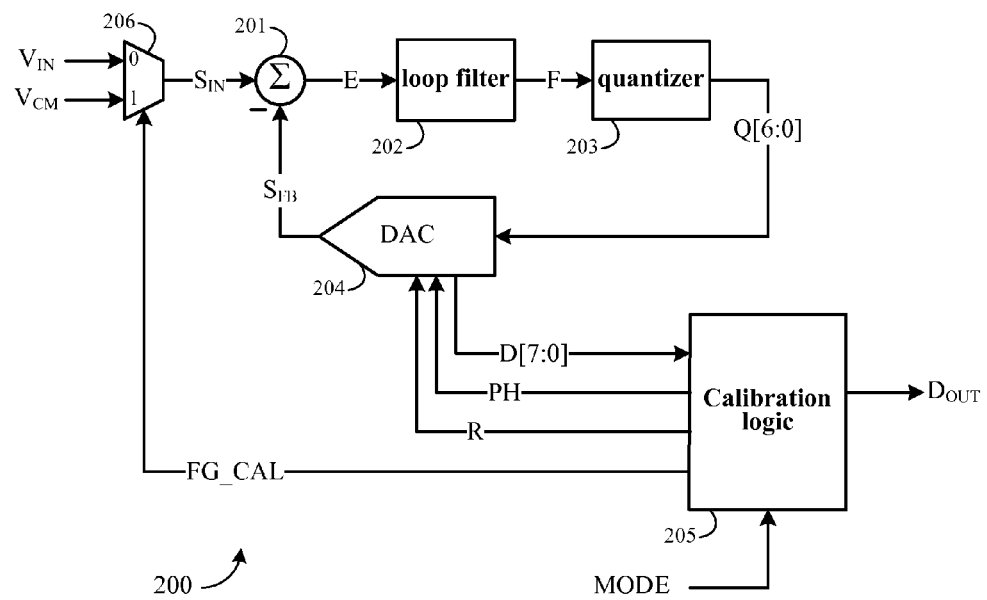
FIG. 2 shows a functional block diagram of a self-calibrated delta-sigma modulator in accordance with an embodiment of the present invention.

By way of example but not limitation, an exemplary self-calibrated DSM (delta-sigma modulator) 200 with 3-bit (i.e., 8-level) quantization in accordance with an embodiment of this present invention is depicted in FIG. 2. DSM 200 comprises a multiplexer 206 for receiving an analog input signal VIN and a common-mode signal VCM and outputting a multiplexed signal SIN in accordance with a selection signal FG_CAL. A summing circuit 201 receives the multiplexed signal SIN and an analog feedback signal SFB and outputting an error signal E. A loop filter 202 receives the error signal E and outputs a filtered signal F. A quantizer 203 receives the filtered signal F and outputs a (7-bit) raw output Q[6:0] (which is thermometer-code encoded into a 7-bit word representing 3-bit, 8-level quantization). A DAC (digital-analog converter) 204 receives the raw output Q[6:0] and outputs the analog feedback signal SFB along with a (8-bit) rotated output D[7:0] in accordance with a phase indicator PH and a rotation number R. Calibration logic 205 receives the rotated output D[7:0] and outputs a calibrated digital output signal DOUT, the selection signal FG_CAL, the phase indicator PH, and the rotation number R, in accordance with an operation mode indicator MODE. The various operation modes will be described in more detail below.

When FG_CAL is logically 1, DSM 200 is in a foreground calibration mode; in this case, the common-mode signal VCM is selected for the multiplexed signal SIN. Otherwise, the analog input signal VIN is selected for the multiplexed signal SIN. Note that the common-mode signal VCM is a fixed-level signal having an amplitude that is approximately at the middle of the output range of DAC 204. It is also noted that the common-mode signal VCM in FIG. 2 can be replaced by other fixed-level signal amplitudes. In an embodiment, loop filter 202 comprises an integrator. In another embodiment, loop filter 202 comprises a plurality of cascaded integrators. In an embodiment, quantizer 203 is a 3-bit flash analog-digital converter comprising seven comparators for comparing the filtered signal F with seven reference levels, resulting in the (7-bit) raw output Q[6:0], which is a thermometer-code representation of a level of the filtered signal F. Summing circuit 201, loop filter 202, quantizer 203, and thermometer code are well known elements in delta-sigma modulators and thus not described in detail here. DAC 204 and calibration logic 205 are unique to the present invention and thus will be described in details in the following paragraphs.

Figure 3:
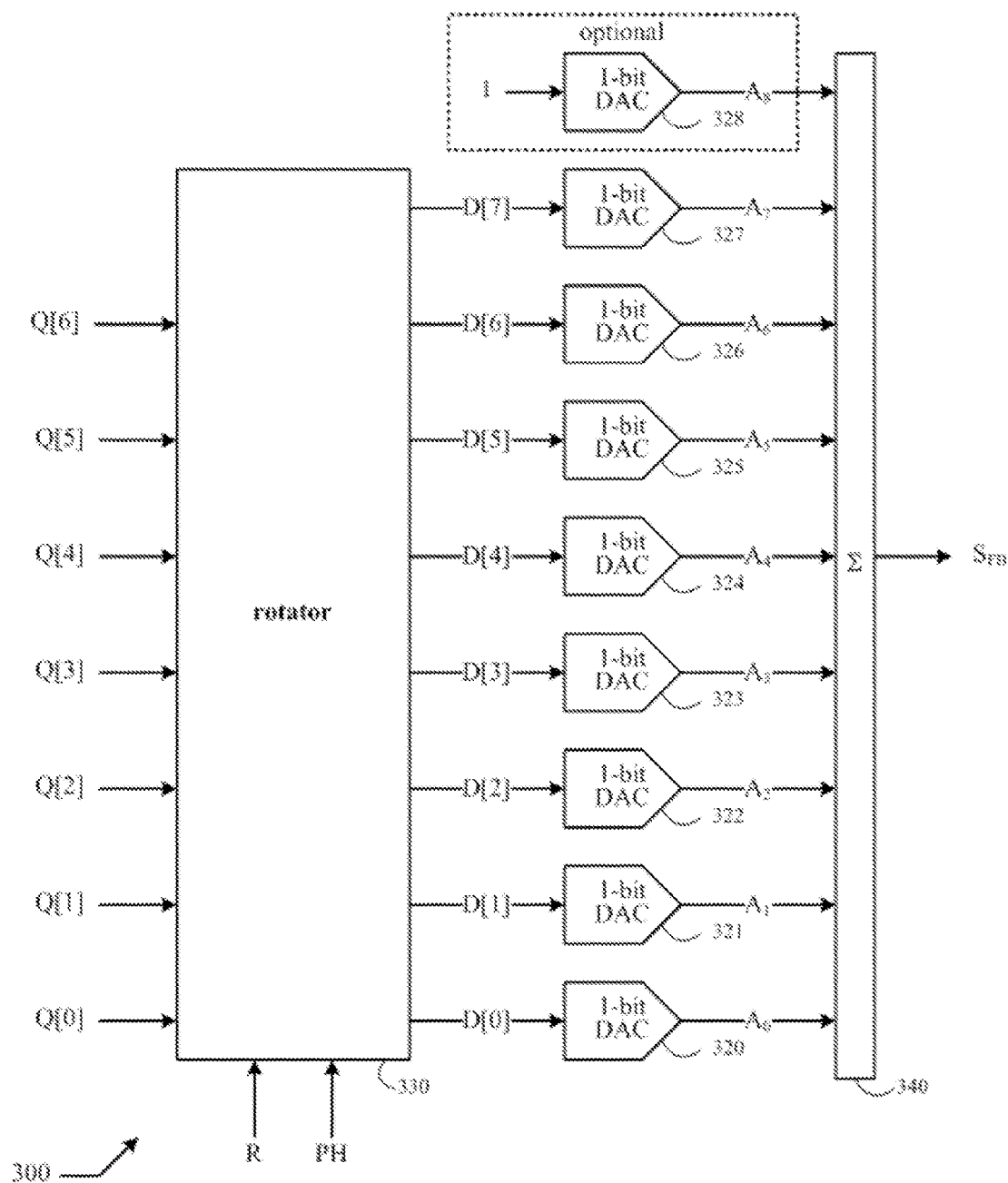
FIG. 3 shows a functional block diagram of a DAC suitable for the delta-sigma modulator of FIG. 2.

A functional block diagram of a DAC 300 suitable for embodying DAC 204 (of DSM 200 in FIG. 2) is shown in FIG. 3. DAC 300 comprises: a rotator 330 for receiving the (7-bit) raw output Q[6:0] and outputting a 8-bit rotated output D[7:0], in accordance with a rotation number R and a phase indicator PH; eight 1-bit DACs 320~327 for receiving D[7:0] and outputting eight analog outputs A0~A7, accordingly and respectively; and a summing circuit 340 for receiving the eight analog outputs A0~A7 and outputting the analog feedback signal SFB Still referring to FIG. 3, rotator 330 is a combinational logic block for generating D[7:0] from Q[6:0] in accordance with R and PH. PH is a binary indicator that is either 1 or 0. R is an integer no less than 0 and no greater than 6. D[7:0] is obtained by performing a rotation on Q[6:0] and introducing an additional bit that is always logical 0. When PH is 0, D[7] is the additional bit that is always set to logical 0, and rotator 330 performs a rotation on Q[6:0] to generate D[6:0] in accordance with the rotation number R. If R is 0, no rotation is performed. If R is 1, Q[6:0] is rotated by one bit (e.g. 7'b0001111 will be rotated to 7'b0011110); if R is 2, Q[6:0] is rotated by two bits (e.g. 7'b0001111 will be rotated to 7'b0111100); if R is 3, Q[6:0] is up rotated by three bits (e.g. 7'b0001111 will be rotated to 7'b1111000); and so on.

When PH is 1, D[7:0] is the same as in the case where PH is 0 except that D[7] and D[R] need to be swapped. For instance, if D[7:0] is 8'b00011110 when PH is 0 and R is 1, then D[7:0] will be 8'b10011100 when PH is 1 and R is 1. If D[7:0] is 8'b00111100 when PH is 0 and R is 2, then D[7:0] will be 8'b10111000 when PH is 1 and R is 2. An embodiment of rotator 330 described in Verilog language is shown in FIG. 4. Mathematically, if PH is 0, then $D[n]=Q[\mod(n-R, 7)]$ for n=0, 1, 2, . . . , 6, and D[7]=0. If PH is 1, then $D[n]=Q[\mod(n-R, 7)]$ for n=0, 1, 2, . . . , 6, except n=R, D[R]=0, and D[7]=Q[0]. The principle of rotator 330 is explained below.

Still referring to FIG. 3, the analog feedback signal SFB is a sum of outputs from the eight 1-bit DACs 320~327. Mathematically, $S_{FB}$ can be written as:

$$S_{FB} = \Sigma_{n=0}^{7} A_n \quad (1)$$

or $$S_{FB} = \Sigma_{n=0}^{7} D[n] W_n \quad (2)$$

where $W_n$ is a weight of the 1-bit DAC corresponding to D[n] (e.g., $W_0$ is the weight of 1-bit DAC 320; $W_1$ is the weight of 1-bit DAC 321; $W_2$ is the weight of 1-bit DAC 322; and so on). If all 1-bit DACs in FIG. 3 are perfect, their weights are exactly equal to a nominal weight. For ease of discussion, let's normalize the nominal weight to 1. (If the actual nominal weight is not 1, the results of discussions will still be the same, aside from a scaling factor due to normalization.) The 7-bit raw output Q[6:0] is a thermometer code that represents one of eight possible integers, ranging from 0 to 7, depending on how may bits among the 7 bits are 1's. The actual value that Q[6:0] represented is: $\Sigma_{n=0}^{6} Q[n]$. For instance, 7'b0000000 represents 0; 7'b0000001 represents 1; 7'b0000011 represents 2; 7'b0000111 represents 3; and so on. When PH is 0, D[6:0] is a R-bit rotation on Q[6:0], i.e. $D[n]=Q[\mod(n-R, 7)]$. The value that D[7:0] represents, i.e. $\Sigma_{n=0}^{7} D[n]$, will be exactly the same as Q[6:0], since the additional bit D[7] is 0 and thus doesn't contribute. When PH is 1, the value that D[7:0] represents, i.e. $\Sigma_{n=0}^{7} D[n]$, will be exactly the same as that in the case where PH is 0, since the difference is the swapping between D[7] and D[R]. This shows that DAC 300 is no different from the case where 1-bit DAC 327 is not used and the other seven 1-bit DACs 320~326 directly receives the 7-bit raw output Q[6:0] without using the rotator 330, if all constituent 1-bit DACs 320~326 are ideal.

Consider the case of foreground calibration (where FG_CAL is 1). Now refer to FIG. 2. In a steady state of DSM 200 where FG_CAL is 1, a mean value of the analog feedback signal SFB must be equal to the common mode signal VCM. (This is a well known principle of delta-sigma modulators.) Using a nominal weight of 1 for each constituent 1-bit DACs within DAC 204 as a measuring stick, the level of the common mode signal VCM is 3.5, on a scale from 0 to 7, which are the floor and ceiling of the output of DAC 204, respectively.

In practice, 1-bit DACs 320~326 are not all ideal and their respective weight may not be exactly 1, and therefore the resulting analog feedback signal SFB may deviate from the ideal value $\Sigma_{n=0}^{6} Q[n]$, causing the analog feedback signal SFB to deviate from VCM, which is 3.5 using the nominal weight of 1-bit DAC as a measuring stick. Now refer back to FIG. 2. The deviation forces DSM 200 to adjusts Q[6:0] so as to reconcile the difference. When the difference is reconciled, the following condition must hold to fulfill a steady state condition of a delta-sigma modulator:

$$S_{FB} = \langle \Sigma_{n=0}^{7} D[n] W_n \rangle = 3.5 \qquad (3)$$

Here, 3.5 is the level of the common-mode signal $V_{CM}$ that is at the middle of the output range of DAC 204 (i.e. between 0 and 7). Now referring back to FIG. 3, assume 1-bit DACs 321~327 are ideal while 1-bit DAC 320 is not, i.e. $W_n=1$ for all n except 0. Also, let R=0 and PH=0. If $W_0$ is 1+ϵ, ωηερε ισ αν ερρορ οϕ 1−βιτΔAX 320, τηεν

$$S_{FB} = \langle \Sigma_{n=0}^{7} D[n] W_n \rangle = \langle D[0]\epsilon + \Sigma_{n=0}^{7} D[n] \rangle = \langle D[0]\epsilon + \Sigma_{n=0}^{6} Q[n] \rangle = 3.5 \qquad (4)$$

Since Q[0] is the lowest bit of the thermometer code, under foreground calibration where $V_{CM}$ is used as multiplexed analog input to the modulator, Q[0] is essentially always 1. Therefore, one obtains $$\epsilon = 3.5 - \langle \Sigma_{n=0}^{6} Q[n] \rangle \qquad (5)$$

That is, the deviation between the nominal value 3.5 and the actual mean value of the raw output Q[6:0] is indeed the error of W0 when PH=0 and R=0. However, in deriving equation (4) one assumes all 1-bit DACs are ideal except for 1-bit DAC 320. To calibrate out the errors due to 1-bit DAC 321~326 while one is calibrating 1-bit DAC 320, one first sets PH=0 and calculates a first calibration value $V_0 = \langle \Sigma_{n=0}^{6} Q[n] \rangle |_{PH=0}$, then sets PH=1 and calculates a second calibration value $V_1 = \langle \Sigma_{n=0}^{6} Q[n] \rangle |_{PH=1}$, then the difference between the second calibration value $V_1$ and the first calibration value $V_0$ will be a good estimate to the error of $W_0$. That is $$\epsilon \langle \Sigma_{n=0}^{6} Q[n] \rangle |_{PH=1} - \langle \Sigma_{n=0}^{6} Q[n] \rangle |_{PH=0} \qquad (6)$$

Similarly, by setting R to 1, and measuring the difference between a mean value of the raw output Q[6:0] with PH being set to 1 and a mean value of the raw output of DSM 200 with PH being set to 0, one obtains an estimate of error of $W_1$, i.e. an error of 1-bit DAC 321. By incrementally changing R from 0 to 6, and for each value one first sets PH to 0 and then sets PH to 1 and then calculates a difference of a mean value of the raw output Q[6:0], one can effectively calibrate 1-bit DAC 320~326, respectively, using 1-bit DAC 327 as the reference for calibration. Note that 1-bit DAC 327 is used as reference for calibration, and its error (i.e. deviation from the nominal weight of 1) leads to a scaling factor that is common to all 1-bit DACs being calibrated.

Now referring back to FIG. 3, 1-bit DAC 327 is introduced as a calibration cell and its input is set to 0 when PH is 0; this usually makes the analog feedback signal $S_{FB}$ biased toward a lower level (because there are more 0's than 1's among the eight 1-bit DACs 320~327), at least initially. To remedy this issue, an additional cell, 1-bit DAC 328, with its input being set to 1, is introduced to offset the effect of the calibration cell 1-bit DAC 327. Note that the use of 1-bit DAC 328 is optional but preferred and recommended.

Now refer to FIG. 2. Calibration logic 205 is a FSM (finite state machine) for generating PH and R for DAC 204 and the calibrated digital output signal $D_{OUT}$ in accordance with the rotated output D[7:0] and the operation mode defined by MODE. In one embodiment, there are four operation modes: RESET, FOREGROUND, BACKGROUND, IDLE. The MODE can be controlled by firmware or specific hardware that determines the operation mode.

The following table illustrates values of the PH, R, and FG_CAL signals for the different operating modes: (The R value and PH Value are not fixed when operating at BACKGROUND MODE AND FOREGROUND MODE, it is difficult to illustrate in this table)

| Mode | R Value | PH Value | FG_CAL Value |
| --- | --- | --- | --- |
| RESET | 0 | 0 | 0 |
| FOREGROUND | | | 1 |
| BACKGROUND | | | 0 |
| IDLE | 0 | 0 | 0 |

In the RESET mode, FG_CAL, PH, and R are all set to 0, and the calibrated digital output signal $D_{OUT}$ is the same as the raw output Q[6:0], except that $D_{OUT}$ is expressed in binary representation, as opposed to thermometer-code representation. This is a factory reset state, where the errors of DAC 204 are not corrected. In the IDLE mode, FG_CAL, PH, and R are all set to 0, and the calibrated digital output signal $D_{OUT}$ is a weighted sum of the 7-bit raw output Q[6:0] based on stored values of the weights $W_n$ (n=0, 1, 2, . . . , 6) stored in registers inside FSM 205. In the FOREGROUND mode, FG_CAL is set to 1 and a foreground calibration is performed. In the BACKGROUND mode, FG_CAL is set to 0 and a background calibration is performed. Note that the background calibration will be functionally similar to the foreground calibration as long as a long term mean value of the analog input signal $V_{IN}$ is approximately equal to the common-mode signal $V_{CM}$ and a long term averaging is used in the calibration. The calibrated digital output signal $D_{OUT}$ is generated in accordance with $$D_{OUT} = \Sigma_{n=0}^{7} D[n] W_n \qquad (7)$$

In the RESET mode, all weights $W_n$ are reset to 1. Therefore, $D_{OUT} = \Sigma_{n=0}^{7} D[n] W_n = \Sigma_{n=0}^{7} D[n] = \Sigma_{n=0}^{6} Q[n]$. In the IDLE mode, the values for weights $W_n$ are frozen. In calibration modes, either foreground or background, the values of weights $W_n$ are calibrated sequentially for n=0, 1, 2, . . . , 6, while $W_7$, the weight of the calibration cell (1-bit DAC 327 of FIG. 3) is always fixed at 1. The calibration of $W_n$ is done by the following procedures:

1. Set the value of R to n (for instance, calibration of $W_3$ is done by setting the value of R to 3)
2. Set PH to 0 for a period of time and calculate a first mean value of $D_{OUT}$
3. Set PH to 1 for a period of time to calculate a second mean value of $D_{OUT}$
4. Subtract the first mean value of $D_{OUT}$ from the second mean value of $D_{OUT}$ to obtain ϵ, an estimate of the error of $W_n$.
5. Update $W_n$ by using $W_n=1+\epsilon$ Note that during calibration, the calibrated digital output signal ($D_{OUT} = \Sigma_{n=0}^{7} D[n] W_n$) is used to estimate the error. Although simply using the raw output $\Sigma_{n=0}^{6} D[n]$ as described earlier is also workable, the calibrated digital output signal is a more accurate representation of the actual output of the delta-sigma modulator and is thus preferred when available. In the initial calibration, all weights ($W_n$ for n=0, 1, 2, 3, . . . , 6) are 1 and thus there is no difference between the raw output and the calibrated digital output signal. Once a weight is calibrated, the calibrated value is used instead of simply using the nominal value of 1 to provide a more accurate output for the delta-sigma modulator.

In background calibration (where FG_CAL is 0), the analog input signal $V_{IN}$ is used instead of the common mode signal $V_{CM}$. However, the principle of the calibration still holds, as long as a mean value of the analog input signal $V_{IN}$ is approximately equal to the common mode signal $V_{CM}$. However, the principle of the calibration won't hold when Q[6:0] is 7'b0000000, where the rotation number R and the phase indicator PH won't affect the analog feedback signal. Therefore, in calculating the mean value of $D_{OUT}$, the sample needs to be tossed out when Q[6:0] is 7'b0000000. In addition, tossing out the samples when Q[6:0] is 7'b0000000 will cause the mean value of $D_{OUT}$ to be biased. To remedy this issue, the sample also needs to be tossed out when Q[6:0] is 7'b1111111.

Figure 5:
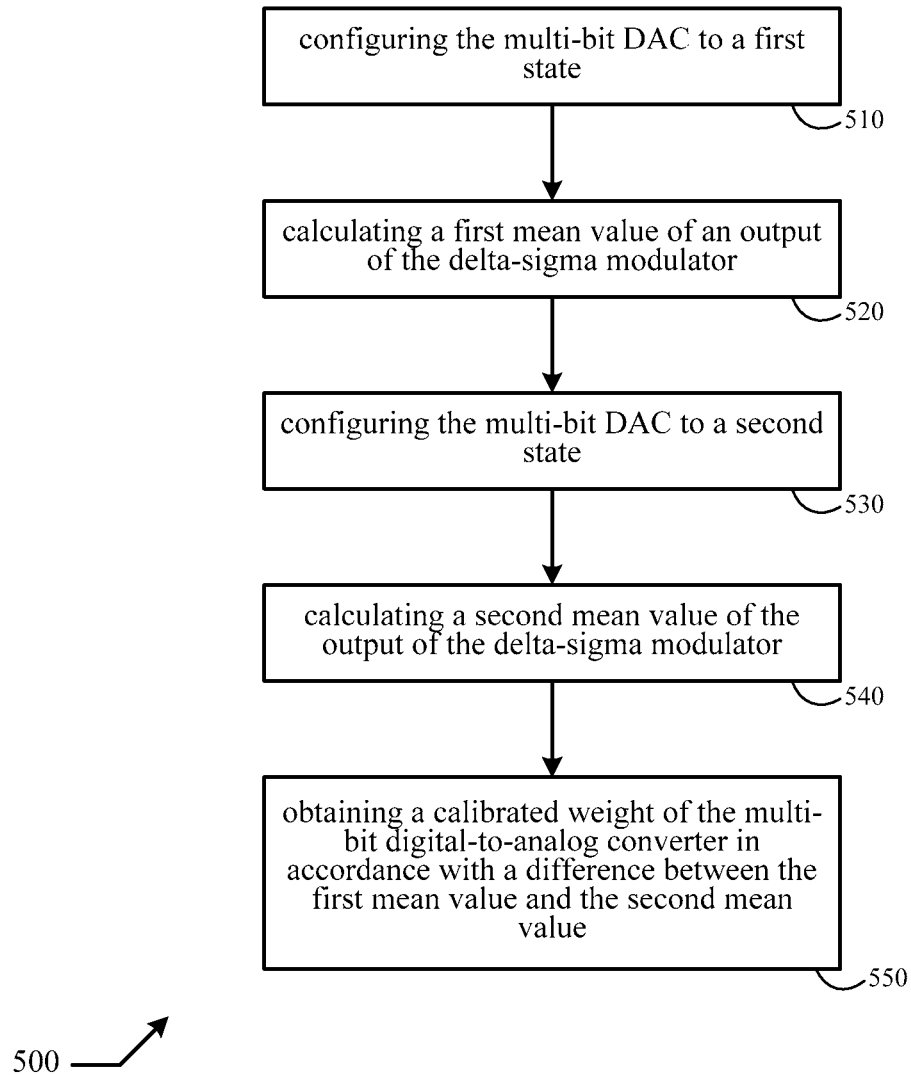
FIG. 5 shows a flow diagram of a method in accordance with an embodiment of the present invention.

In an embodiment shown in flow diagram 500 of FIG. 5, a method comprises: step 510 for configuring a multi-bit digital-to-analog converter (DAC) within a delta-sigma modulator (DSM) into a first state; step 520 for calculating a first mean value of an output of the DSM; step 530 for configuring the multi-bit DAC into a second state; step 540 for calculating a second mean value of the output of the DSM; step 550 for obtaining a calibrated weight of the multi-bit DAC in accordance with a difference between the first mean value and the second mean value; and step 560 for outputting a calibrated digital output signal for the DSM based on a weighted sum of the output of DSM in accordance with the calibrated weight of the multi-bit DAC, wherein: the multi-bit DAC comprises a plurality of single-bit DAC cells, and a difference in configuration between the first state and the second state is that two constituent cells among said plurality of single-bit DAC cells are swapped.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A delta-sigma modulator comprising:
a multiplexer for receiving an analog input signal and a common mode signal and outputting a multiplexed signal in accordance with a selection signal;
a summing circuit for receiving the multiplexed signal and an analog feedback signal and outputting an error signal;
a loop filter for receiving the error signal and outputting a filtered signal;
a quantizer for receiving the filtered signal and outputting a raw digital output signal;
a digital-to-analog converter for receiving the raw digital output signal and outputting the analog feedback signal along with a rotated digital output signal in accordance with a phase indicator and a rotation number; and
calibration logic for receiving the rotated digital output signal and a mode indicator and outputting the selection signal, the phase indicator, the rotation number, and a calibrated digital output signal.

2. The delta-sigma modulator of claim 1, wherein the digital-to-analog converter comprises a rotator for rotating the raw digital output signal into the rotated digital output signal in accordance with the phase indicator and the rotation number.

3. The delta-sigma modulator of claim 2, wherein the digital-to-analog converter further comprising a plurality of single-bit digital-to-analog converter cells for outputting the analog feedback signal in accordance with the rotated digital output signal.

4. The delta-sigma modulator of claim 3, wherein the calibration logic outputs the calibrated digital output signal by performing a weighted sum of the rotated digital output signal and using a plurality of calibrated weights for each of said plurality of single-bit digital-to-analog converter cells.

5. The delta-sigma modulator of claim 4, wherein each of said plurality of calibrated weights is obtained by specifying a corresponding rotation number, and calculating a difference between a first mean value of the calibrated digital output signal when the phase indicator is in a first state and a second mean value of the calibrated digital output signal when the phase indicator is in a second state.

6. The delta-sigma modulator of claim 5, wherein the calibration logic operates in one of a plurality of operation modes, including a reset mode, a foreground calibration mode, a background calibration mode, and an idle mode, in accordance with the mode indicator.

7. The delta-sigma modulator of claim 6, wherein: in either the foreground calibration or the background calibration mode, a value of the rotation number is changed sequentially, and for the same value of the rotation number, the phase indicator is set to the first state for a duration where the first mean value of the calibrated digital output signal is calculated, and then set to the second state where the second mean value of the calibrated digital output signal is calculated.

8. A delta-sigma modulator comprising:
a multiplexer for receiving an analog input signal and a fixed reference voltage signal and outputting a multiplexed signal in accordance with a selection signal;
a summing circuit for receiving the multiplexed signal and an analog feedback signal and outputting an error signal;
a loop filter for receiving the error signal and outputting a filtered signal;
a quantizer for receiving the filtered signal and outputting a raw digital output signal;
a digital-to-analog converter for receiving the raw digital output signal and outputting the analog feedback signal along with a rotated digital output signal; and
a calibration logic for outputting a calibrated digital output signal in accordance with the rotated digital output signal.

9. The delta-sigma modulator of claim 8, wherein the digital-to-analog converter comprises a rotator for rotating the raw digital output signal into the rotated digital output signal.

10. The delta-sigma modulator of claim 9, wherein the digital-to-analog converter further comprising a plurality of single-bit digital-to-analog converter cells for outputting the analog feedback signal in accordance with the rotated digital output signal.

11. The delta-sigma modulator of claim 10, wherein the calibration logic outputs the calibrated digital output signal by performing a weighted sum of the rotated digital output signal and using a plurality of calibrated weights for each of said plurality of single-bit digital-to-analog converter cells.

12. The delta-sigma modulator of claim 11, wherein each of said plurality of calibrated weights is obtained by calculating a difference between a first mean value of the calibrated digital output signal and a second mean value of the calibrated digital output signal.

13. The delta-sigma modulator of claim 12, wherein the calibration logic operates in one of a plurality of operation mode, including a reset mode, a foreground calibration mode, a background calibration mode, and an idle mode.

14. The delta-sigma modulator of claim 8, wherein the calibration logic outputs the calibrated digital output signal by calculating a difference between a first mean value of the calibrated digital output signal and a second mean value of the calibrated digital output signal.

15. The delta-sigma modulator of claim 8, wherein the digital-to-analog converter is a multi-bit digital-to-analog converter.

* * * * *